Figure 1:
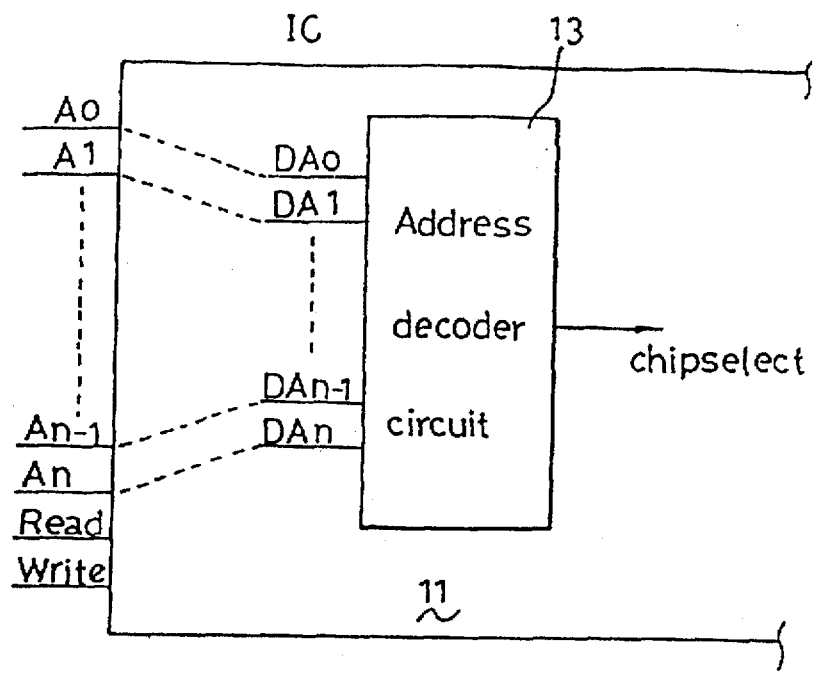

United States Patent
Tsai et al.

[11] Patent Number: 5,721,708
[45] Date of Patent: Feb. 24, 1998

[54] REDUCTION OF THE ADDRESS PINS OF THE INTEGRATED CIRCUIT

[75] Inventors: Hsi-Jung Tsai; Ching-Chi Huang, both of Hsinchu, Taiwan

[73] Assignee: Winbond Electronics Corp., Taipei, Taiwan

[21] Appl. No.: 679,883

[22] Filed: Jul. 15, 1996

[51] Int. Cl.⁶ .................................................. G10C 8/00
[52] U.S. Cl. ........................... 365/230.02; 365/230.08
[58] Field of Search ....................... 365/230.02, 240.03, 365/230.04, 230.08, 230.06

[56] References Cited

U.S. PATENT DOCUMENTS 5,371,866  12/1994  Cady ........................ 305/230.02

FOREIGN PATENT DOCUMENTS 0277763  8/1988  European Pat. Off. ......... 365/230.02
0223687  9/1989  Japan ............................. 305/230.02
0113487  4/1990  Japan ............................. 365/230.02

*Primary Examiner*—David C. Nelms
*Assistant Examiner*—Son Mai

[57] ABSTRACT

A method is provided to input an address signal $A_0$, $A_1$, $A_2$~$A_{n-1}$, $A_n$ to an integrated circuit. The integrated circuit includes an address decoder for providing a select signal. The method includes (1) inputting value of $A_1$, $A_3$~$A_n$ to the address decoder during a first time interval, and, during the first time interval, an access-control signal being disabled to prohibit access operation by the integrated circuit; and (2) inputting value of $A_{526}$, $A_2$~$A_{n-1}$ to the address decoder during a second time interval, and, during the second time interval, the access-control signal being enabled to allow access operation corresponding to address value of $A_{526}$, $A_1$, $A_2$~$A_{n-1}$, $A_n$.

12 Claims, 3 Drawing Sheets

REDUCTION OF THE ADDRESS PINS OF THE INTEGRATED CIRCUIT

TECHNICAL FIELD OF INVENTION

The invention relates to a method and circuit for inputting address signals to an integrated circuit using reduced number of address pins.

BACKGROUND OF INVENTION

The state-of-art process of integrated circuit (IC) allows much higher scale of circuit integration on a single silicon chip. As a result, the complicated circuits within the chip requires more external pins configuration to communicate with external devices. Typically, as number of pins of an integrated circuit increases, the IC package cost increases accordingly. Therefore, the cost involved in making an integrated circuit rests mainly on number of pins configured instead of number of circuits integrated. The designer sometimes has to choose a second-choice IC package, which has higher number of pins than needed, just because his circuit design needs one or two more pins than number of pins of the best-choice IC package within his list. For instance, in field of personal computer, the most popular package used is Quad Flat Package (QFP) with 100 pins or 160 pins configuration. If, after the evaluation of the circuit integration, the design needs 101 or 102 external pins, the most cost-effective Quad Flat Package with 100 pins can not be employed. And when IC package with 160 pins is utilized, the package cost definitely increases, other than the drawback of inherent increase of size of the corresponding printed circuit board. From another point of view, reducing the scale of integration will definitely affect the competitiveness of the integration circuit in the market place.

The instant invention, based on the above observations, uses an external multiplexer circuit with an IC of reduced address pins to input the address signals.

The invention makes reduced number of address pins of an IC possible while keeping higher integration scale of the circuit.

The conventional arrangement of the address pins of integrated circuit is shown in FIG. 1. It is evident that when address signals $A_\varnothing \sim A_n$ are required, the integrated circuit needs n+1 pins to connect the address lines. Those address pins are respectively thereafter connected to $DA_\varnothing \sim DA_n$ of the address decoder 13 within the integrated circuit 11. The signals then are used by the address decoder 13 to generate the chip select signal.

Figure 2:
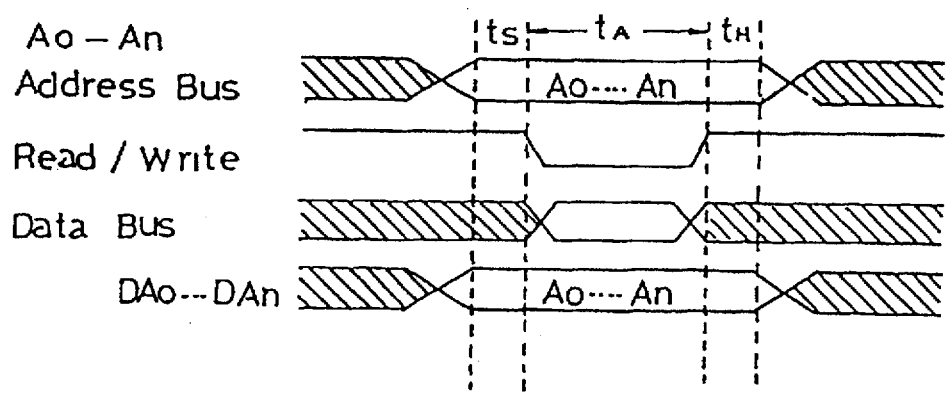

The FIG. 2 shows the timings address bus signals and (Read/Write) signals when read or write access to the integrated circuit is performed. In typical, the signals on the address bus was activated earlier than Read/Write signal which provides a setup time to internal address decoder 13 to decode the address value. As Read/Write signal is activated, the Data Bus within the integrated circuit is 11 then open to connect to the external data bus which allows the operation of data read or data write. It is obvious from FIG. 2, the address signals $A_\varnothing \sim A_n$ are effective only during the activation of the Read/Write signal, i.e., the interval of tA.

SUMMARY OF THE INVENTION

A method and circuit for inputting the address signals to an integrated circuit using reduced number of address pins is provided.

The method includes (1) inputting value of $A_1, A_3 \sim A_n$ to the address decoder during a first time interval, and, during the first time interval, an access-control signal is disabled to prohibit access operation; and (2) inputting value of $A_\varnothing$, $A_2 \sim A_{n-1}$ to the address decoder during a second time interval, and, during the second time interval, the access-control signal is enabled to allow access operation corresponding to address value of $A_\varnothing, A_1, A_2 \sim A_{n-1}, A_n$.

The circuit for inputting an address signal $A_\varnothing, A_1, A_2 \sim A_{n-1}, A_n$, includes an integrated circuit having an address decoder for receiving value of the address signals and a multiplexer.

The multiplexer has a plurality of input terminals for receiving the address signals $A_\varnothing, A_1, A_2 \sim A_{n-1}, A_n$, and supplying value of $A_1, A_3 \sim A_n$ during a first time interval to the address decoder. During the first time interval, an access-control signal is disabled to prohibit access operation of the integrated circuit. The multiplexer supplies value of $A_{526}, A_2 \sim A_{n-1}$ to the address decoder during a second time interval. During the second time interval, the access-control signal is enabled to allow access operation corresponding to address value of $A_\varnothing, A_1, A_2 \sim A_{n-1}, A_n$.

BRIEF DESCRIPTION OF THE APPENDED DRAWINGS

FIG. 1 discloses address pins arrangement according to one conventional approach.

FIG. 2 shows the timings of signals in FIG. 1.

Figure 3:
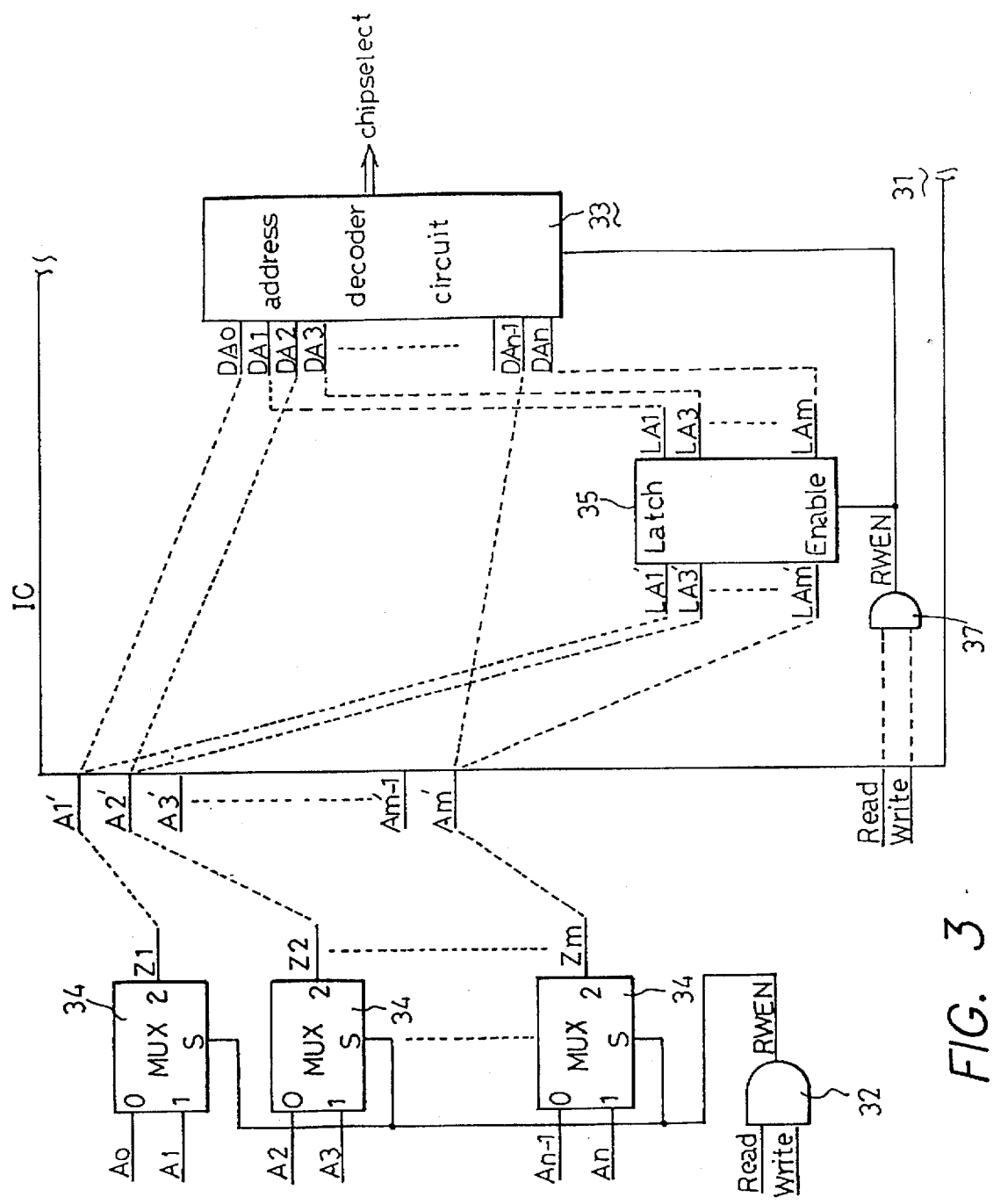

FIG. 3 discloses the instant invention in block forms.

Figure 4:
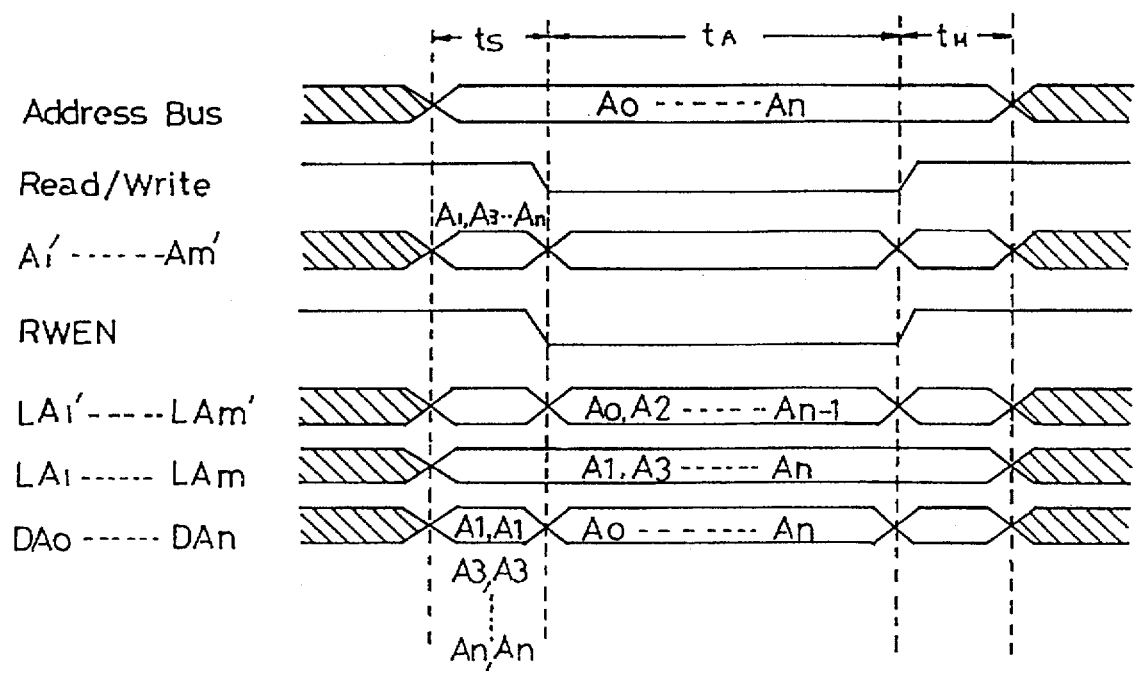

FIG. 4 shows the timings of signals regarding to the instant invention.

DETAILED DESCRIPTIONS OF THE PREFERRED EMBODIMENT

As shown in FIG. 3, the circuit of the invention, including an integrated circuit 31 and a plurality of multiplexer 34, inputs the address signals $A_\varnothing, A_1, A_2 \sim A_{n-1}, A_n$. The integrated circuit 31 has an address decoder 33 which has address input lines $DA_\varnothing, DA_1, DA_2 \sim DA_n$ for inputting the address signals $A_\varnothing, A_1, A_2 \sim A_{n-1}, A_n$ at specified time interval. The multiplexer 34 has two inputs which receive the address signals $(A_\varnothing, A_1), (A_2, A_3) \ldots (A_{n-1}, A_n)$ respectively in accordance with the way shown in FIG. 3. Under control of RWEN signal, the multiplexers 34 inputs value of $A_1, A_3 \sim A_n$ to the address decoder 33 during a first time interval. During this first time interval, the RWEN :signal is disabled to prohibit the integrated circuit performing the access operation. Afterwards, the multiplexers 34 supply value of $A_\varnothing, A_2 \sim A_{n-1}$ to the address decoder 33 during a second time interval. During the second time interval, the RWEN signal is enabled to allow the access operation by the integrated circuit. The descriptions of timings may be referred to the corresponding recitations regarding to FIG. 4.

The integrated circuit 31 includes an address latch 35 for latching values of $A_1, A_3 \sim A_n$ during the first time interval and outputting these values to the address decoder 33. The RWEN signal, which is the select signal to the multiplexers 34, is obtained by ANDing the Read and Write signals. Furthermore, the RWEN signal is also the signal enabling the address latch 35. The RWEN signal may be input to the address latch 35 via one external pin of the integrated circuit (not shown), or, alternatively, may be generated within the integrated circuit by the AND gate 37 within the integrated circuit 31.

Referring to FIG. 4, during tS in which RWEN signal is logic HIGH, the terminals $Z_1 \sim Z_m$ of the multiplexer 34 outputs values of $A_1, A_3 \sim A_n$. Therefore, the pins $A_1' \sim A_m'$ of the integrated circuit 31 input values of $A_1, A_3 \sim A_n$. During this time interval, the inputs ($LA_1' \sim LA_m'$) and outputs ($LA_1, LA_3 \sim LA_m$) of address latch 35 within the integrated circuit 31 have values of $A_1, A_3 \sim A_n$. At this time, the input lines $DA_\emptyset, DA_1, DA_2 \sim DA_n$ of the address decoder 33 receive values of $A_1, A_1, A_3, \sim A_n, A_n$. Although this address value is not correct, the IC chip 31 would not actually perform the access corresponding to this incorrect address due to the inactivation of the RWEN signal. Once the RWEN signal changes to logic LOW, the address latch 35 turns off in response and lines $LA_1, LA_3 \sim LA_m$ hold values of $A_1, A_3 \sim A_n$. During this time interval, the external multiplexer 34 shifts to the input of pin $\emptyset$. The terminals $Z_1 \sim Z_m$ output values of $A_\emptyset, A_2 \sim A_{n-1}$, the pins $A_1', A_2' \sim A_m'$ of integrated circuit 31 and $DA_\emptyset, DA_2 \sim DA_{n-1}$ of address decoder 33 input values of $A_\emptyset, A_2 \sim A_{n-1}$. Although, during this time, $LA_1, \sim LA_m$ have values of $A_\emptyset, A_2 \sim A_{n-1}$, value of $LA_1(DA_1), LA_3(DA_3) \sim LA_m(DA_n)$ are still $A_1, A_3, A_5 \sim A_n$ due to inactivation state of the address latch 35. Therefore, during the tA interval of FIG. 4, the values seen by the address decode 33 are $A_\emptyset, A_1, A_2 \sim A_{n-1}$ as required for access operation.

There are different ways for the multiplexers 34 to receive the address signals $A_\emptyset, A_1, A_2 \sim A_{n-1}, A_n$ which are still within the intended scope of protection of the appended claims. For instance, alternatively, the first multiplexer 34 may receive address signals $A_\emptyset, A_{(N+1)/2}$, while the second multiplexer 34 inputs $A_1, A_{(n+3)/2}$, and the third multiplexer 34 inputs $A_2, A_{(n+5)/2}$, etc.. By this arrangement, $A_{(n+1)/2}, A_{(n+3)/2} \sim A_n$ are input to the address decoder 33 during the first time interval in which the Read/Write signal is disabled. And $A_\emptyset, A_1 \sim A_{(n-1)/2}$ are input to the address decoder 33 during the second time interval in which the Read/Write signal is enabled to allow the access operation.

It is also evident that inputting value of $A_{526}, A_2 \sim A_{n-1}$ to the address decoder during a first time interval, and inputting value of $A_1, A_3 \sim A_n$ to the address decoder during a second time interval is another modification of the instant invention in light of the above recitation and appended drawings.

We claim:

1. A method for inputting an address signal having n+1 sub-signals into an integrated circuit, n being an odd integer greater than 2, said sub-signals identifiable as $A_0, A_1, A_2 \sim A_{n-1}, A_n$, the integrated circuit including an address decoder for selectively providing a select signal responsive to a read/write control signal, the method comprising the steps of:

inputting sub-signals representative of $A_1, A_3 \sim A_n$ to the address decoder during a first time interval, with, during the first time interval, the read/write control signal being disabled to prohibit access operation for the address signal;

inputting sub-signals representative of $A_0, A_2 \sim A_{n-1}$ to the address decoder during a second time interval, with, during the second time interval, the read/write control signal being enabled to allow access operation corresponding to the address sub-signals $A_0, A_1, A_2 \sim A_{n-1}, A_n$.

2. The method as recited in claim 1, wherein, during the first time interval, the address decoder receives input sub-signals representative of $A_1, A_2, A_3, A_3 \sim A_n, A_n$.

3. Apparatus for inputting an address signal having n+1 sub-signals, n being an odd integer greater than 2, said sub-signals identifiable as $A_0, A_1, A_2 \sim A_{n-1}, A_n$, comprising:

an integrated circuit having an address decoder;

a multiplexer means having a plurality of input terminals for receiving sub-signals representative of $A_0, A_1, A_2 \sim A_{n-1}, A_n$, the multiplexer means supplying sub-signals representative of $A_1, A_3 \sim A_n$ during a first time interval to the address decoder, with, during the first time interval, a read/write control signal being disabled to prohibit access operation for the address signal, the multiplexer means supplying sub-signals representative of $A_0, A_2 \sim A_{n-1}$ to the address decoder during a second time interval, with, during the second time interval, the read/write control signal being enabled to allow access operation corresponding to the address sub-signals $A_0, A_1, A_2 \sim A_{n-1}, A_n$.

4. Apparatus as recited in claim 3, wherein the integrated circuit further comprises:

an address latch for supplying sub-signals representative of $A_1, A_3 \sim A_n$ to the address decoder during the first time interval.

5. A method for inputting an address signal having n+1 sub-signals into an integrated circuit, n being an odd integer greater than 2, said sub-signals identifiable as $A_0, A_1, A_2 \sim A_{n-1}, A_n$, the integrated circuit including an address decoder for selectively providing a select signal responsive to a read/write control signal, the method comprising the steps of:

inputting sub-signals representative of $A_{(n+1)/2}, A_{(n+3)/2} \sim A_n$ to the address decoder during a first time interval, with, during the first time interval, the read/write control signal being disabled to prohibit access operation for the address signal;

inputting sub-signals representative of $A_0, A_1 \sim A_{(n-3)/2}, A_{(n-1)/2}$ to the address decoder during a second time interval, with, during the second time interval, the read/write control signal being enabled to allow access operation corresponding to the address sub-signals $A_0, A_1, A_2 \sim A_{n-1}, A_n$.

6. The method as recited in claim 5, wherein, during the first time interval, the address decoder receives input sub-signals representative of $A_{(n+1)/2}, A_{(n+1)/2}, A_{(n+3)/2}, A_{(n+3)/2} \sim A_n, A_n$.

7. Apparatus for inputting an address signal having n+1 sub-signals, n being an odd integer greater than 2, said sub-signals identifiable as $A_0, A_1, A_2 \sim A_{n-1}, A_n$, comprising:

an integrated circuit having an address decoder;

a multiplexer means having a plurality of input terminals for receiving the address signals $A_0, A_1, A_2 \sim A_{n-1}, A_n$, the multiplexer means supplying sub-signals representative of $A_{(n+1)/2}, A_{(n+3)/2} \sim A_n$ during a first time interval to the address decoder, with, during the first time interval, a read/write control signal being disabled to prohibit access operation for the address signal, the multiplexer means supplying sub-signals representative of $A_0, A_1, \sim A_{(n-3)/2}, A_{(n-1)/2}$ to the address decoder during a second time interval, with, during the second time interval, the read/write control signal being enabled to allow access operation corresponding to the address sub-signals $A_0, A_1, A_2 \sim A_{n-1}, A_n$.

8. Apparatus as recited in claim 7, wherein the integrated circuit further comprises:

an address latch for supplying sub-signals representative of $A_{(n+1)/2}, A_{(n+3)/2} \sim A_n$ to the address decoder during the first time interval.

9. A method for inputting an address signal having n+1 sub-signals into an integrated circuit, n being an odd integer greater than 2, said sub-signals identifiable as $A_0, A_1, A_2 \sim A_{n-1}, A_n$, the integrated circuit including an address decoder for selectively providing a select signal responsive to a read/write control signal, the method comprising the steps of:

inputting sub-signals representative of $A_0, A_2 \sim A_{n-1}$ to the address decoder during a first time interval, with, during the first time interval, the read/write control signal being disabled to prohibit access operation for the address signal;

inputting sub-signals representative of $A_1, A_3 \sim A_n$ to the address decoder during a second time interval, with, during the second time interval, the read/write control signal being enabled to allow access operation corresponding to the address sub-signals $A_0, A_1, A_2 \sim A_{n-1}, A_n$.

10. The method as recited in claim 9, wherein, during the first time interval, the address decoder receives input sub-signals representative of $A_0, A_0, A_2, A_2 \sim A_{n-1}, A_{n-1}$.

11. Apparatus for inputting an address signal having n+1 sub-signals, n being an odd integer greater than 2, said sub-signals identifiable as $A_0, A_1, A_2 \sim A_{n-1}, A_n$, comprising:

an integrated circuit having an address decoder;

a multiplexer means having a plurality of input terminals for receiving the address signals $A_0, A_1, A_2 \sim A_{n-1}, A_n$, the multiplexer means supplying sub-signals representative of $A_0, A_2 \sim A_{n-1}$ during a first time interval to the address decoder, with, during the first time interval, a read/write control signal being disabled to prohibit access operation for the address signal, the multiplexer means supplying sub-signals representative of $A_1, A_3 \sim A_n$ to the address decoder during a second time interval, with, during the second time interval, the read/write control signal being enabled to allow access operation corresponding to the address sub-signals $A_0, A_1, A_2 \sim A_{n-1}, A_n$.

12. Apparatus as recited in claim 11, wherein the integrated circuit further comprises:

an address latch for supplying sub-signals representative of $A_0, A_2, \sim A_{n-1}$ to the address decoder during the first time interval.

* * * * *